(12) United States Patent
Cheng et al.

(10) Patent No.: US 7,536,299 B2
(45) Date of Patent: May 19, 2009

(54) CORRELATING AND DECORRELATING TRANSFORMS FOR MULTIPLE DESCRIPTION CODING SYSTEMS

(75) Inventors: Corey I. Cheng, San Francisco, CA (US); Claus Bauer, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 534 days.

(21) Appl. No.: 11/312,230

(22) Filed: Dec. 19, 2005

(65) Prior Publication Data

US 2007/0150272 A1    Jun. 28, 2007

(51) Int. Cl.
*G10L 19/00*    (2006.01)

(52) U.S. Cl. .................. 704/203; 704/216; 704/230

(58) Field of Classification Search .................. None
See application file for complete search history.

(56) References Cited

U.S. PATENT DOCUMENTS

| | | |
|---|---|---|
| 6,198,412 B1 | 3/2001 | Goyal |
| 6,215,787 B1 | 4/2001 | Kovacevic et al. |
| 6,253,185 B1 | 6/2001 | Arean |
| 6,301,222 B1 | 10/2001 | Kovacevic et al. |
| 6,345,125 B2 | 2/2002 | Goyal et al. |
| 6,680,972 B1 | 1/2004 | Liljeryd et al. |
| 6,708,145 B1 | 3/2004 | Liljeryd et al. |
| 2001/0016079 A1 | 8/2001 | Goyal et al. |
| 2001/0016080 A1 | 8/2001 | Goyal et al. |
| 2001/0040871 A1 | 11/2001 | Abrahamsson et al. |
| 2003/0138047 A1* | 7/2003 | Orchard et al. ......... 375/240.13 |
| 2004/0102968 A1 | 5/2004 | Tian et al. |
| 2004/0141656 A1* | 7/2004 | Irvine et al. .................. 382/240 |

OTHER PUBLICATIONS

Schuller, et al., "Robust Low-Delay Audio Coding Using Multiple Descriptions" IEEE Transactions on Speech and Audio Processing, vol. 13, No. 5, Sep. 2005, pp. 1014-1024, XP002428562.

Goyal, et al., "Generalized multiple description coding with correlating transforms," IEEE Transactions on Information Theory, IEEE Service Center, Piscataway, NJ, US, vol. 47, No. 6, Sep. 2001, pp. 2199-2224, XP002185451.

Arean et al., "Multiple Description Perceptual Audio Coding with Correlating Transforms," IEEE Trans. on Speech and Audio Proc., Mar. 2000, vol. 8, No. 2, pp. 140-145.

(Continued)

*Primary Examiner*—David R Hudspeth
*Assistant Examiner*—Matthew J Sked
(74) *Attorney, Agent, or Firm*—David N. Lathrop, Esq.; Gallagher & Lathrop

(57) ABSTRACT

Transmitters and receivers in multiple description coding systems use correlating and decorrelating transforms to generate and process multiple descriptions of elements of an input signal. The multiple descriptions include groups of correlating transform coefficients that permit recovery of an inexact facsimile of the signal if some of the correlating transform coefficients are lost or corrupted during transmission. Noiseless implementations of the correlating and decorrelating transforms are described that allow the signal elements to be quantized with different quantizing resolutions. Implementations using the Fast Hadamard Transform are described that reduce the resources needed to perform the transforms.

24 Claims, 5 Drawing Sheets

OTHER PUBLICATIONS

Dietz et al., "Spectral Band Replication, A Novel Approach in Audio Coding," Audio Eng. Soc. 112th Conv., Munich, Germany, May 2002, paper No. 5553.

Ehret,. "State-of-the-Art Audio Coding for Broadcasting and Mobile Applications," Audio Eng. Soc. 114th Conv., Amsterdam, the Netherlands, Mar. 2003; paper No. 5834.

Geiger et al., "Fine Grain Scalable Perceptual and Lossless Audio Coding Based on IntMDCT," IEEE Int. Conf. on Acoust., Speech and Sig. Proc., Hong Kong, Apr. 2003.

Geiger et al., "Integer Low Delay and MDCT Filter Banks," 36th Asilomar Conf. on Sig., Sys. and Computers, Pacific Grove, CA, 2002.

Geiger et al., "Improved Integer Transforms for Lossless Audio Coding," Asilomar Conf. on Sig., Sys. and Computers, Pacific Grove, CA, 2003.

Goyal, "Multiple Description Coding: Compression Meets the Network," IEEE Signal Processing Magazine, Sep. 2001, pp. 74-93.

Goyal, "Transform Coding with Integer-to-Integer Transforms," IEEE Trans. on Information Theory, Mar. 2000, vol. 62, No. 2, pp. 465-473.

Goyal et al., "Generalized Multiple Description Coding with Correlating Transforms," IEEE Trans. on Information Theory, Sep. 2001, vol. 47, No. 6, pp. 2199-2224.

Goyal et al., "Optimal Multiple Description Transform Coding of Gaussian Vectors," Proc. IEEE Data Compression Conference 1998.

Lauber et al., "Error Concealment for Compressed Digital Audio," Audio Eng. Soc. 111th Conv., New York, Sep. 2001, paper No. 5460.

Liang et al., "Fast Multiplierless Approximations of the DCT with the Lifting Scheme," IEEE Trans. on Sig. Proc., Dec. 2001, vol. 49, No. 12, pp. 2032-3044.

Wang et al., "Multiple Description Coding Using Trellis Coded Quantization," Proc. IEEE Sig. Proc. Soc. 1997 Workshop on Multimedia Sig. Proc., Jun. 1997.

Wang, "Multiple Description Image Coding for Noisy Channels by Pairing Transform Coefficients," Proc. IEEE Sig. Proc. Soc. 1997 Workshop on Multimedia Sig. Proc., Jun. 1997.

Wang, "Optimal Pairwise Correlating Transforms for Multiple Description Coding," IEEE Int. Conf. on Image Proc., Oct. 1998.

Wang et al. "Multiple Description Coding Using Pairwise Correlating Transforms," IEEE Trans. on Image Proc. Mar. 2001, vol. 10, No. 3, pp. 351-366.

Wiese, "Error Concealment Strategies for Digital Audio Broadcasting," Audio Eng. Soc. 92nd Conv., Vienna, Mar. 1992, preprint No. 3264.

Yokotani et al., "Lossless Audio Compression Using Integer Modified Discrete Cosine Transform," 2003 Int. Symp. on Intelligent Sig. Proc. and Comm. Sys., (ISPACS 2003), Japan, Dec. 2003, pp. 120-126.

* cited by examiner

CORRELATING AND DECORRELATING TRANSFORMS FOR MULTIPLE DESCRIPTION CODING SYSTEMS

TECHNICAL FIELD

The present invention pertains generally to audio and video coding and pertains more specifically to multiple-description coding systems and techniques.

BACKGROUND ART

Multiple description (MD) coding systems and techniques encode a source signal into two or more parts or "descriptions" each containing an amount of information that is sufficient to permit reconstruction of a lower quality version of the original source signal. Ideally, the decoder in a MD coding system can reconstruct a reasonable facsimile of the source signal from one or more of these descriptions but the fidelity of the reconstructed facsimile increases as the number of descriptions increases.

The basic idea behind MD coding systems is to divide an encoded signal into two or more descriptions so that each description represents a reasonable facsimile of the original source signal and so that each description shares some information with other descriptions. The decoder in a MD coding system gathers information from as many of these descriptions as possible, estimates the content of any missing descriptions from the information contained in the received descriptions, and reconstructs a facsimile of the source signal from the received and estimated descriptions.

MD coding techniques are attractive in a variety of applications where portions of an encoded signal may be lost or corrupted during transmission because they can provide a graceful degradation in the quality of a reconstructed facsimile as transmission-channel conditions become increasingly challenging. This characteristic is especially attractive for wireless packet networks that operate over relatively lossy transmission channels. Additional information about MD coding systems and techniques can be obtained from Goyal, "Multiple description coding: compression meets the network," IEEE Signal Processing Magazine, September, 2001.

A number of MD techniques are known that may be used to divide encoded information into parts or descriptions. Some techniques apply a correlating transform to encoded information that distributes the information into two or more parts in a reversible or invertible way. Each part can be assembled into a separate bitstream or packet for storage or transmission. Unfortunately, known techniques for using correlating transforms can inject quantization noise into the encoded information that is divided into parts, which may degrade the perceived quality of the facsimile that is reconstructed by a decoder. Furthermore, known ways of implementing correlating transforms are computationally intensive, which requires a considerable amount of computational resources to perform the calculations needed for the transforms.

What is needed is a way to apply correlating transforms to encoded information that introduces little if any quantization noise and can be implemented efficiently.

DISCLOSURE OF INVENTION

According to one aspect of the present invention, a signal is processed for use in a multiple-description coding system by applying a correlating transform to sets of quantized signal elements to generate corresponding sets of transform coefficients, where the sets of quantized signal elements have different quantizing resolutions that represent signal components of the signal and the correlating transform permits exact recovery of the quantized signal elements from the transform coefficients by a complementary decorrelating transform.

According to another aspect of the present invention, a signal is processed for use in a multiple-coding system by applying a Hadamard transform to sets of quantized signal elements to generate values from which corresponding sets of transform coefficients are derived, where each set of quantized signal elements is less correlated than the corresponding set of transform coefficients.

According to yet another aspect of the present invention, an encoded signal is processed for use in a multiple-description coding system by applying a decorrelating transform to sets of transform coefficients obtained from the encoded signal to recover exact replicas of sets of quantized signal elements that were input to a complementary correlating transform, where the quantized signal elements have different quantizing resolutions and represent signal components of a signal.

According to a further aspect of the present invention, an encoded signal is processed for use in a multiple-description coding system by applying an inverse Hadamard transform to values derived from sets of transform coefficients to generate corresponding sets of quantized signal elements, where each set of transform coefficients is more correlated than the corresponding set of quantized signal elements.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Introduction

1. System Overview

Figure 1:
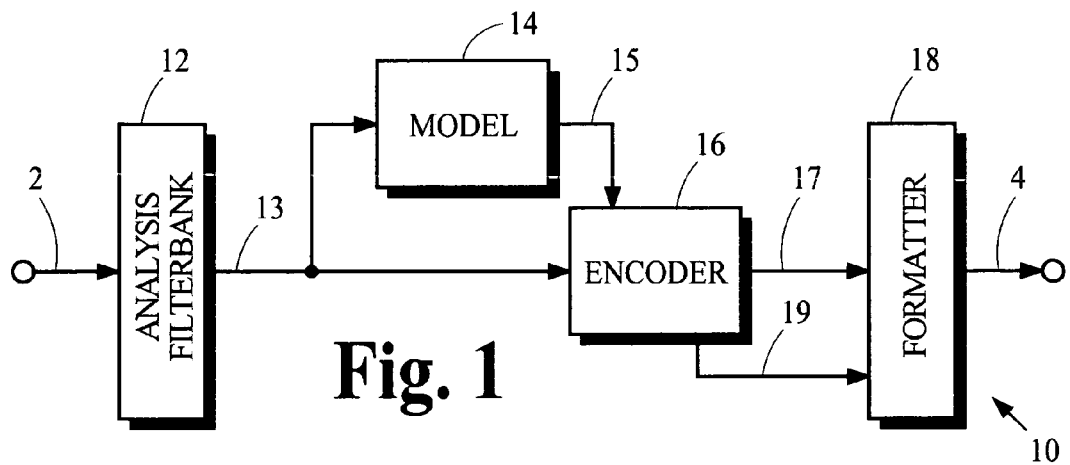
FIGS. 1 and 2 are schematic block diagrams of a transmitter and a receiver in a coding system in which various aspects of the present invention may be incorporated.

FIG. 1 is a schematic block diagram of one example of a transmitter 10 in a perceptual coding system. In this particular example, the transmitter 10 applies the analysis filterbank 12 to the source signal 2 to generate frequency subband signals 13, and applies the perceptual model 14 to the subband signals 13 to assess the perceptual masking properties of the source signal 2. The encoder 16 quantizes elements of the subband signals 13 with quantizing resolutions chosen according to control information 15 received from the perceptual model 14 and encodes the quantized subband signal elements into multiple descriptions 17, which are assembled by the formatter 18 into an encoded signal 4. In preferred implementations, the encoder 16 also provides an estimated spectral contour 19 of the source signal 2 for inclusion in the encoded signal 4. Various aspects of the present invention may be incorporated into the encoder 16 to facilitate the generation of the multiple descriptions 17.

Figure 2:
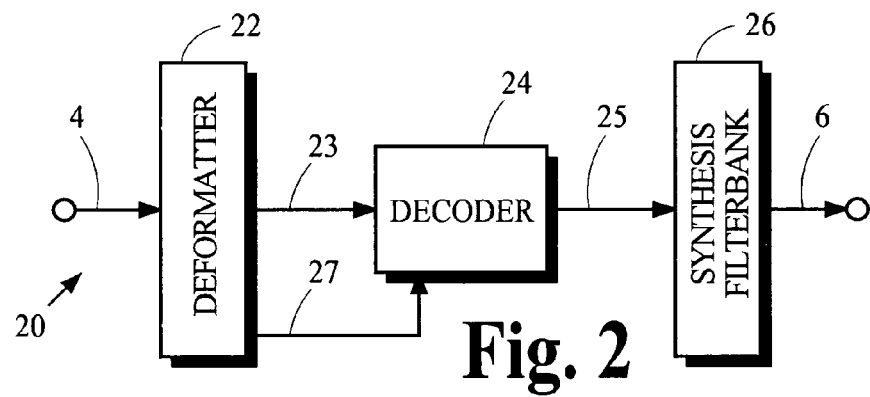

FIG. 2 is a schematic block diagram of one example of a receiver 20 in a perceptual coding system. The receiver 20 uses the deformatter 22 to obtain multiple descriptions 23 from the encoded signal 4 and, in preferred implementations, obtains an estimated spectral contour 27 of the source signal 2 from the encoded signal 4. The decoder 24 recovers a replica of the subband signals 25 from all or some of the multiple descriptions. The output signal 6, which is a reconstructed facsimile of the source signal 2, is generated by applying the synthesis filterbank 26 to the recovered subband signals 25. Various aspects of the present invention may be incorporated into the decoder 24 to facilitate the processing of the multiple descriptions 23.

2. Filterbanks

The analysis and synthesis filterbanks 12, 26 may be implemented in a variety of ways including block and wavelet transforms, banks or cascades of digital filters like the Quadrature Mirror Filter, recursive filters and lattice filters. In one particular implementation of an audio coding system that is discussed in more detail below, the analysis filterbank 12 is implemented by a Modified Discrete Cosine Transform (MDCT) and the synthesis filterbank 26 is implemented by a complementary Inverse Modified Discrete Cosine Transform (IMDCT), which are described in Princen et al., "Subband/Transform Coding Using Filter Bank Designs Based on Time Domain Aliasing Cancellation," Proceedings of the 1987 International Conference on Acoustics, Speech and Signal Processing (ICASSP), May 1987, pp. 2161-64. According to this implementation, the analysis filterbank 12 is applied to overlapping segments of the source signal 2 with 2N samples in each segment to generate blocks of MDCT coefficients or signal elements that represent spectral components of the source signal. The filterbank generates 2N coefficients in each block. The encoder 16 quantizes one-half of the MDCT coefficients in each block with varying quantizing resolutions that are chosen according to perceptual models, and assembles information representing the quantized coefficients into the encoded signal 4. The synthesis filterbank 26 is applied to blocks of MDCT coefficients that the decoder 24 recovers from the encoded signal 4 to generate blocks of signal samples with 2N samples each. Only one-half of the MDCT coefficients in each block are encoded and input to the decoder 24 because the other half of the MDCT coefficients contain redundant information. These blocks of samples are combined in a particular way that cancels time-domain aliasing artifacts to generate segments of the output signal 6 that are facsimiles of the input source signal 2.

The examples discussed here refer to perceptual coding systems that quantize signal elements such as MDCT coefficients according to perceptual models; however, the use of perceptual coding is not critical. Furthermore, the present invention may be used in coding systems that do not use filterbanks to split a source signal into subband signals. The present invention may be used in coding systems that quantize essentially any type of signal elements such as transform coefficients or signal samples using differing quantizing resolutions that are chosen according to any criteria that may be desired. MDCT coefficients, spectral coefficients or spectral components and the like that are referred to in the following discussion are merely examples of signal elements.

3. Encoder

Figure 3:
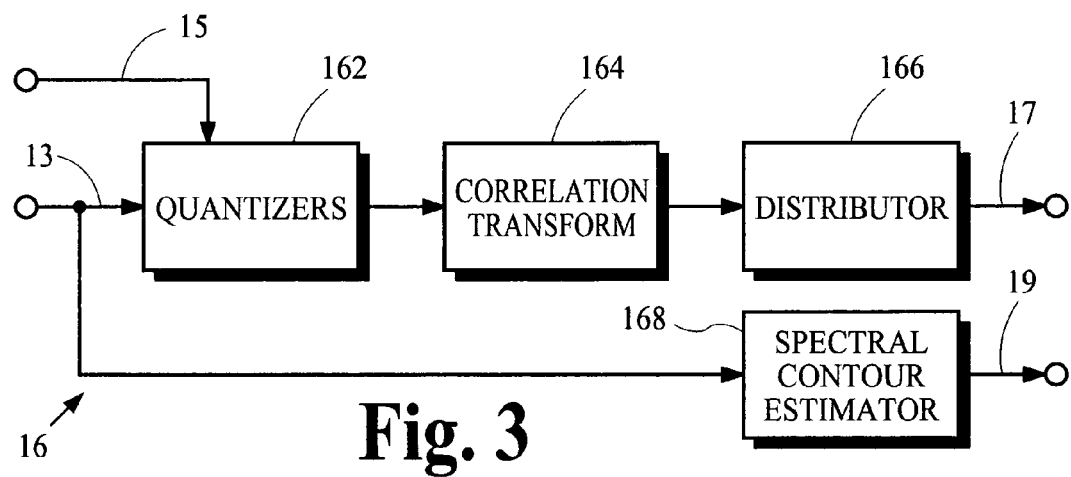
FIG. 3 is a schematic block diagram of one implementation of an encoder.

FIG. 3 is a schematic block diagram of one implementation of the encoder 16 in which a block of 2N MDCT coefficients or elements is generated for segments of the source signal 2. One-half of the MDCT coefficients in each block are quantized by quantizers 162 using quantizing resolutions that are chosen in response to the control information 15 received from the perceptual model 14. The correlating transform 164 is applied to blocks of the quantized MDCT coefficients to generate sets of correlating transform (CT) coefficients. The distributor 166 generates multiple descriptions 17 of the source signal 2 by distributing the CT coefficients into groups of quantized values that contain sufficient information to permit an inexact facsimile of the source signal to be reconstructed from one or more of the groups but a more accurate facsimile can be reconstructed from a larger number of groups. The groups are assembled into the encoded signal 4. In the implementation shown in the figure, a spectral contour estimator 168 obtains variances of the MDCT coefficients and provides them as an estimated spectral contour 19 of the source signal 2. The multiple descriptions 17 and the estimated spectral contour 19 may be entropy encoded.

In one exemplary implementation, the information conveyed by the encoded signal 4 is arranged in packets. The CT coefficients for a segment of the source signal 2 are conveyed in different packets. Each packet conveys CT coefficients for two or more segments of the source signal 2. This arrangement produces a form of time diversity that adds latency to the coding system but reduces the likelihood of total loss of any block of MDCT coefficients. The receiver 20 can reconstruct useable information for each block of MDCT coefficients from less than all of the CT coefficients, which allows an inexact facsimile of the source signal 2 to be reconstructed even if some CT coefficients are lost or corrupted during transmission.

4. Decoder

Figure 4:
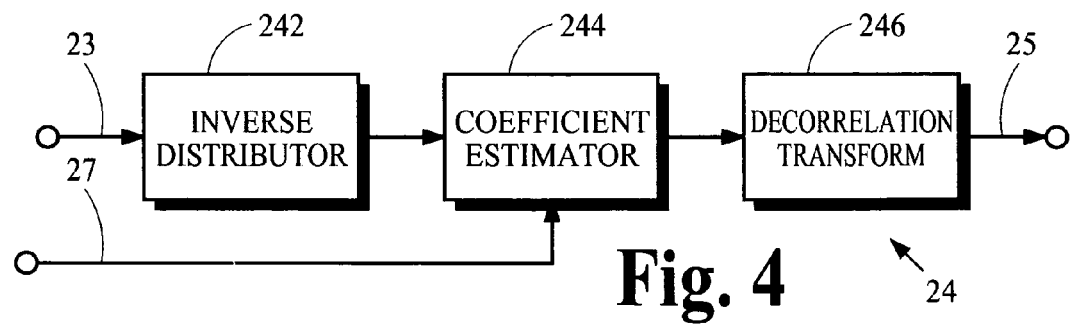
FIG. 4 is a schematic block diagram of one implementation of a decoder.

FIG. 4 is a schematic block diagram of one implementation of the decoder 24 in which an inverse distributor 242 collects CT coefficients from groups of quantized values obtained from the encoded signal 4 using a process that is an inverse of the distribution process carried out by the distributor 166. If any group of quantized values is missing or corrupted, one or more CT coefficients will also be missing or corrupted. The coefficient estimator 244 obtains estimates of any missing or corrupted CT coefficients. The receiver 20 may use the estimated spectral contour 27 to improve the accuracy of the reconstructed signal when one or more packets are lost or corrupted during transmission. The decorrelating transform 246 is applied to the sets of CT coefficients to recover blocks of N quantized MDCT coefficients. If no CT coefficient for a particular segment of the source signal 2 is missing or corrupted, then the blocks of quantized MDCT coefficients recovered by the decorrelating transform 246 should be identical to the blocks of quantized MDCT coefficients that were input to the correlating transform 164. If some CT coefficients are missing or corrupted, the coefficient estimator 244 and the decorrelating transform 246 may use a variety of interpolation and statistical estimation techniques to derive estimates of missing or corrupted CT coefficients from the other CT coefficients and the estimated spectral contour to produce quantized MDCT coefficients with as little error as possible. Examples of these statistical techniques are discussed in Goyal et al., "Generalized Multiple Descriptions with Correlating Transforms," IEEE Trans. on Information Theory, vol. 47, no. 6, September 2001, pp. 2199-2224. If all CT coefficients for a particular segment of the source signal 2 are missing or corrupted, other forms of error mitigation may be used such as repeating the information for a previous segment.

5. Correlating Transform

The correlating transform 164 may be implemented by tiers or levels of linear 2×2 transforms in cascade with one another in which each 2×2 transform operates on pairs of input values to generate pairs of output values. One known linear 2×2 transform that may be used to implement the correlating transform 164 can be expressed as:

$$\begin{bmatrix} y_{2n,t} \\ y_{2n+1,t} \end{bmatrix} = \begin{bmatrix} \alpha & \frac{1}{2\alpha} \\ -\alpha & \frac{1}{2\alpha} \end{bmatrix} \begin{bmatrix} y_{n,t-1} \\ y_{\frac{N}{2}+n,t-1} \end{bmatrix} \forall n \in \left[0, \frac{N}{2} - 1\right], \quad (1)$$

$$\forall t \in [1, T], \alpha > 0$$

where $y_{n,t}$=quantized MDCT coefficient n in a block of N coefficients just prior to level t of the transforms in a total of T levels; and $\alpha$=a correlation parameter.

The transform expressed in equation 1 can be implemented by two "for" loops in a computer program, where the 2×2 transforms in a particular level or tier t operate on all N coefficients in a block before proceeding to the next level. This correlating transform can be interpreted as a transform that mixes the value of a low-frequency MDCT coefficient with the value of a high-frequency MDCT coefficient according to the parameter $\alpha$. The output values are dominated by the value of the low-frequency coefficient for large values of $\alpha$ and are dominated by the value of the high-frequency coefficient for small values of $\alpha$. The correlating transform 164 is performed more times as the value of T increases. The output values that are generated by this correlating transform constitute a set of the CT coefficients, which may be denoted as $\{y_{n,T}\}$ for $0 \leq n \leq N-1$. The transform expressed in equation 1 is an attractive choice in many practical coding systems because there are known optimal methods by which lost or corrupted CT coefficients can be estimated. For example, see Goyal et al., IEEE Trans. on Info. Theory, vol. 47, no. 6, September 2001, cited above.

Although T may be set to any value, setting $T=\log_2(N)$ causes each CT coefficient to be dependent on each of the MDCT coefficients. As a result, using a value of $T>\log_2(N)$ provides little if any additional error mitigating benefit. In many practical audio coding systems, N is generally greater than or equal to 512. The computational resources needed to implement a correlating transform in such a system with $T=\log_2(N)$ may be unacceptably large; therefore, it may be necessary to choose a value for T that is less than $\log_2(N)$ such as 1, 2, 3 or 4. Furthermore, because the CT coefficients are separated into different descriptions, the value for T may also specify a limit to the number of different descriptions that can be used. For the correlating transform expressed in equation 1, the number of descriptions D is set equal to $2^T$.

6. Decorrelating Transform

MDCT coefficients can be recovered from the CT coefficients by a decorrelating transform. The complementary decorrelating transform 246 may be expressed as:

$$\begin{bmatrix} y_{n,t-1} \\ y_{\frac{N}{2}+n,t-1} \end{bmatrix} = \begin{bmatrix} \frac{1}{2\alpha} & \frac{-1}{2\alpha} \\ \alpha & \alpha \end{bmatrix} \begin{bmatrix} y_{2n,t} \\ y_{2n+1,t} \end{bmatrix} \forall n \in \left[0, \frac{N}{2} - 1\right], \quad (2)$$

$$\forall t \in [1, T], \alpha > 0$$

This transform can be implemented by two "for" loops in a computer program in which t has an initial value equal to T and decreases to 1.

7. Distributor

The distributor 166 groups the set of CT coefficients into mutually exclusive subsets of CT coefficients. Each subset constitutes one of the multiple descriptions 17 of the source signal 2. The distributor constructs the descriptions such that each description contains enough information about the source to allow recovery of a low-quality version of the source. Preferably, the descriptions are constructed such that a decoder can recover an exact replica of the encoded source signal if all of the descriptions are available. If any of the descriptions are lost or corrupted, the correlation between coefficients in the descriptions that are available to the decoder can be used to estimate missing or corrupted information. In one implementation, the distributor 166 constructs D descriptions by assembling every D-th CT coefficient into a respective description. If the distributor 166 constructs four descriptions, for example, then CT coefficients 0, 4, 8, 12, . . . may be assembled into a first description, CT coefficients 1, 5, 9, 13, . . . may be assembled into a second description, CT coefficients 2, 6, 10, 14, . . . may be assembled into a third description, and CT coefficients 3, 7, 11, and 15 may be assembled into a fourth description. The distributor 166 may be implemented in a variety of ways.

The distributor 166 may "diversify" the descriptions in a number of ways such as, for example, separating the descriptions for transmission during different time periods (time diversification), for transmission using different carrier frequencies (frequency diversification), for transmission using different channels (channel diversification), or by using various combinations of these and other diversification methods. As another example, the distributor 166 may group for transmission several descriptions from different sources (source diversification).

8. Inverse Distributor

The inverse distributor 242 forms as complete a set of CT coefficients as possible from the descriptions that are received in the encoded signal 4. The coefficients in the descriptions may be buffered and processed to reverse the effects of any diversification schemes such as those described above. When all descriptions for a given source have been received, or when any real-time performance constraints at the decoder dictate that decoding of the source must proceed, the inverse distributor 242 arranges the CT coefficients in a manner that is inverse to the distribution carried out by the distributor 166.

In a coding system that uses an implementation of the distributor 166 as described above, the inverse distributor 242 may collate the CT coefficients from the descriptions that are available. If the fourth out of the four descriptions is missing or corrupted, for example, the collated set of coefficients would comprise CT coefficients 0, 1, 2, X, 4, 5, 6, X, 8, 9, 10, X, 12, 13, 14, X, ..., where the symbol X represents a missing or corrupted coefficient. These missing or corrupted coefficients may be estimated from the CT coefficients that are available to the decoder. In preferred implementations that provide an estimated spectral contour in the encoded signal 4, this contour may be used with a variety of contour estimation techniques such as spectral interpolation, spectral renormalization and low-frequency variance estimation to improve the accuracy of the estimates.

Essentially any combination of the contour estimation techniques mentioned above can be used in the spectral contour estimator 168. Spectral interpolation and spectral renormalization are well-known techniques that are described in Lauber et al., "Error Concealment for Compressed Digital Audio," Audio Eng. Soc. 111th Convention, New York, September 2001. Low-frequency variance estimation is described below. Statistical techniques used to estimate missing coefficients using spectral contour information can be found in Goyal et al., IEEE Trans. on Info. Theory, vol. 47, no. 6, September 2001, cited above.

B. Aspects of the Invention

There are two problems with the correlating and decorrelating transforms that are implemented directly from equations 1 and 2. The first problem is increased quantization noise. In typical coding systems, the MDCT coefficients that are input to the correlating transform 164 are represented by values that have been quantized with a quantizing resolution that was selected according to control information 15 from the perceptual model 14 to satisfy perceptual criteria and bit-rate constraints. The CT coefficients that are obtained from equation 1, however, are values that generally do not have the same quantizing resolution because the value of the parameter α may be chosen to meet the needs of the coding system. The CT coefficients are quantized prior to assembly into the encoded signal 4 to meet bit-rate constraints.

Quantization of the CT coefficients is undesirable because it increases the noise that already will be present in the MDCT coefficients that are recovered by the decoder 24. This increase in noise may degrade the perceived quality of the encoded signal. In other words, quantization of the CT coefficients prevents the decoder 24 from recovering the same MDCT coefficients that were input to the encoder 16. The difference between these coefficients may manifest itself as audible noise.

This problem exists for all values of α except for $\alpha=\frac{1}{2}\sqrt{2}$. If α has this particular value, an exact recovery of the original quantized MDCT coefficients is possible because the magnitude of all of the matrices in equations 1 and 2 are the same. Calculations needed to perform the correlating and decorrelating transforms can be expressed as a single scaling of integer-arithmetic operations. Because the integer-arithmetic operations are lossless, the MDCT coefficients that are input to the correlating transform of equation 1 can be recovered exactly by the decorrelating transform of equation 2.

The second problem with a direct implementation of the transforms in equations 1 and 2 is that these implementations require considerable computational resources for even modest values of T. This problem is particularly acute for the decorrelating transform 246 in the decoder 24 for those applications that require an inexpensive implementation of the receiver 20. An efficient implementation for these two transform is described below.

1. Noiseless Transforms

Transforms that are analogous to the correlating and decorrelating transforms in equations 1 and 2 are shown below in equations 3 and 4, respectively.

$$\begin{bmatrix} y_{2n,t} \\ y_{2n+1,t} \end{bmatrix} = \left( \begin{bmatrix} 1 & \frac{(\alpha-1)}{\alpha} \\ 0 & 1 \end{bmatrix} \begin{bmatrix} 1 & 0 \\ -\alpha & 1 \end{bmatrix} \begin{bmatrix} 1 & \frac{(2\alpha-1)}{2\alpha^2} \\ 0 & 1 \end{bmatrix} \begin{bmatrix} y_{n,t-1} \\ y_{\frac{N}{2}+n,t-1} \end{bmatrix}_Q \right)_Q \right)_Q \quad (3)$$

$$\begin{bmatrix} y_{n,t-1} \\ y_{\frac{N}{2}+n,t-1} \end{bmatrix} = \left( \begin{bmatrix} 1 & \frac{(1-2\alpha)}{2\alpha^2} \\ 0 & 1 \end{bmatrix} \begin{bmatrix} 1 & 0 \\ \alpha & 1 \end{bmatrix} \begin{bmatrix} 1 & \frac{(\alpha-1)}{\alpha} \\ 0 & 1 \end{bmatrix} \begin{bmatrix} y_{2n,t} \\ y_{2n+1,t} \end{bmatrix}_Q \right)_Q \right)_Q \quad (4)$$

where $(V)_Q$ denotes quantization of both elements of a vector V by quantizer Q.

Figure 5:
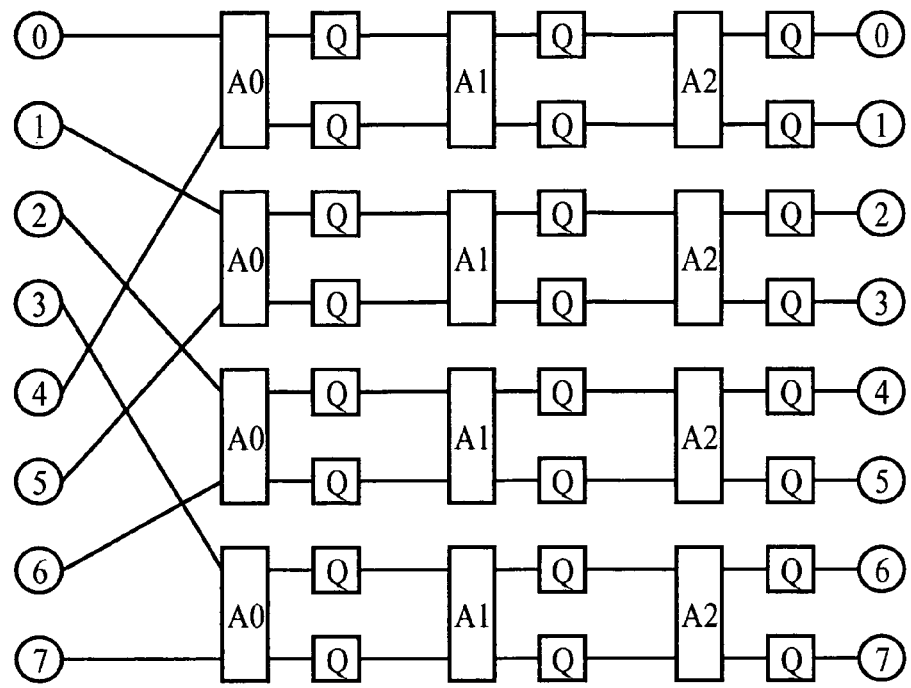
FIG. 5 is a schematic block diagram of the first level of a correlating transform using quantizers with homogeneous quantizing resolutions.

The first tier or level t=1 of the correlating transform in equation 3 is shown by a schematic block diagram in FIG. 5 for a block of eight MDCT coefficients. Audio and video coding systems usually process blocks with considerably more coefficients but a block of eight coefficients is chosen for the examples discussed here to reduce the complexity of the illustrations. The Q blocks in the figure represent quantizers. The A# blocks represent one of the three 2×2 matrices shown in equation 3. For example, the block A0 represents the third matrix on the right-hand side of the equation and the block A2 represents the first matrix. Lines connecting the blocks show how coefficients flow through the correlating transform. A block of eight quantized MDCT coefficients (n=0 to 7) are input to the transform at the circular terminals labeled 0 to 7 on the left-hand side of the figure. A set of eight CT coefficients (n=0 to 8) are output to the circular terminals labeled 0 to 7 on the right-hand side of the figure. The subsequent level t=2 of the transform, which is not shown in the figure, receives these CT coefficients and processes them in a similar fashion.

Figure 6:
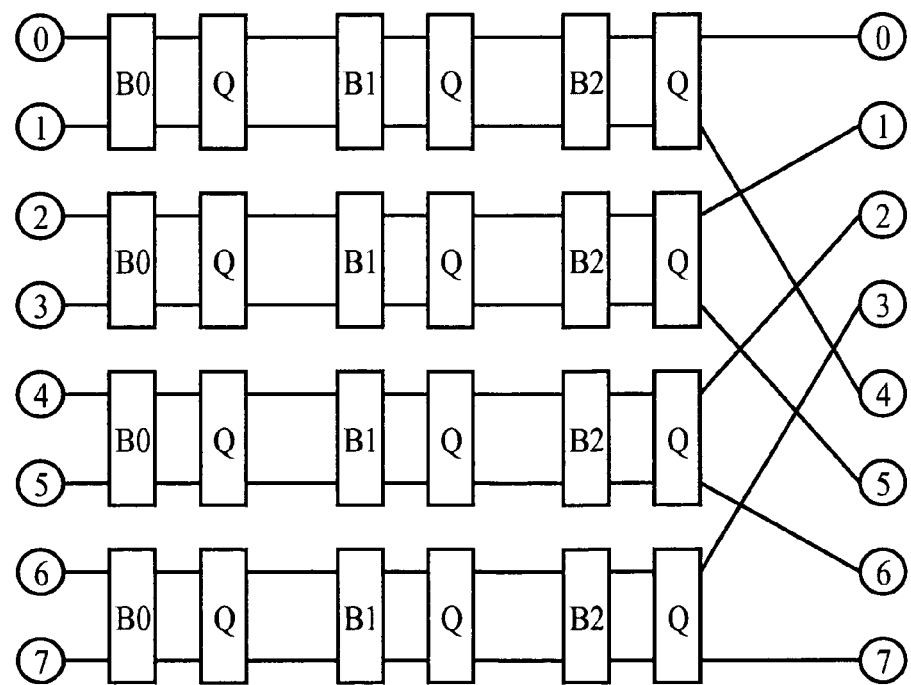
FIG. 6 is a schematic block diagram of the last level of a decorrelating transform using quantizers with homogeneous quantizing resolutions.

The last tier or level t=1 of the decorrelating transform in equation 4 is shown by a schematic block diagram in FIG. 6 for a set of eight CT coefficients. The Q blocks in the figure represent quantizers. The B# blocks represent one of the three 2×2 matrices shown in equation 4. For example, the block B0 represents the third matrix on the right-hand side of the equation and the block B2 represents the first matrix. Lines connecting the blocks show how coefficients flow through the decorrelating transform. The set of eight CT coefficients (n=0 to 7) are received from the previous level t=2 of the transform and are input to the circular terminals labeled 0 to 7 on the left-hand side of the figure. A block of eight quantized MDCT coefficients (n=0 to 7) are output to the circular terminals labeled 0 to 7 on the right-hand side of the drawing.

If all of the quantizers Q in all levels of the two transforms quantize their inputs with the same quantizing resolution and if they obey the properties $$Q(p+q)=p+Q(q) \tag{5a}$$

$$Q(-p)=-Q(p) \tag{5b}$$

where p and q are 2-vectors, then the correlating transform shown in equation 3 generates quantized CT coefficients that do not need further quantization to meet bit-rate constraints, unlike the CT coefficients generated by the correlating transform shown in equation 1. The MDCT coefficients that are input to the correlating transform of equation 3 can be recovered exactly by the decorrelating transform of equation 4. No quantization noise is added.

Unfortunately, the transforms shown in equations 3 and 4 are not useful in many practical coding systems because of the restrictions imposed on the quantizers Q. All MDCT coefficients must be quantized with the same quantizing resolution and the two properties expressed in equations 5a and 5b imply only uniform odd-symmetric quantizers can be used. These restrictions are not practical. Perceptual coding systems quantize the MDCT coefficients with different quantizing resolutions to exploit psychoacoustic masking effects as much as possible. Furthermore, many coding systems use non-uniform quantizers. The restrictions of homogeneous and uniform quantizing resolutions that are imposed on the quantizers can be eliminated using the techniques that are described below.

a) Heterogeneous Uniform Quantizing Resolutions

Noiseless correlating and decorrelating transforms can be implemented with quantizers using different or heterogeneous quantizing resolutions. Algorithms are discussed below that specify which quantizing resolution to use at intermediate points within the correlating and decorrelating transforms. All of the quantizing resolutions that are used within the transforms are drawn from the set of quantizing resolutions that are used to quantize the input MDCT coefficients. The decoder 24 must be able to determine which quantizing resolutions to use. If necessary, the encoder 16 can include in the encoded signal 4 any information that the decoder 24 will require.

The quantizing resolutions that are used to quantize each value in a pair of values that are input to a 2×2 matrix may differ from one another. It may be helpful to explain how the quantizing resolutions follow the coefficients through the correlating and decorrelating transforms.

The algorithms mentioned above are represented below in fragments of a computer program source code with statements that have some syntactical features of the BASIC programming language. These source code fragments do not represent practical programs but are presented to help explain how the quantizing resolutions are specified and used. The source code fragment for Program-1 describes an algorithm that specifies the quantizers for a correlating transform. The source code fragment for Program-2 describes an algorithm that specifies the quantizers for a decorrelating transform. The source code fragments for Program-3 and Program-4 describe algorithms that specify how to use the various quantizers in a correlating and a decorrelating transform, respectively.

The source code fragments have statements that use the following notations:

$Q\{n\}$=quantizer used to quantize MDCT coefficient n, where $0 \leq n \leq N-1$.

$Q\{n,t\}$=quantizer used to quantize $y_{n,t}$ in transform level t, where $1 \leq t \leq T$.

It may be helpful to point out that the first tier or level in the correlating transform is level t=1 and the last level is level t=T but the first level in the decorrelating transform is level t=T and the last level is level t=1.

The quantizers $Q\{n\}$ and $Q\{n,t\}$ obey the properties expressed above in equations 5a and 5b, which may be expressed as:

$$Q\{n\}(p+q)=p+Q\{n\}(q) \tag{5c}$$

$$Q\{n\}(-p)=-Q\{n\}(p) \tag{5d}$$

$$Q\{n,t\}(p+q)=p+Q\{n,t\}(q) \tag{5e}$$

$$Q\{n,t\}(-p)=-Q\{n,t\}(p) \tag{5f}$$

Program-1: specify quantizers for a correlating transform
  For n=0 to N−1 //Initialize transform level 1
    Q{n,0}=Q{n}
  For t=1 to T //Initialize all other stages and levels
    For n=0 to ½N−1
      Q{2n,t}=Q{n,t−1}
      Q{2n+1,t}=Q{½N+n,t−1}

Program-2: specify quantizers for a decorrelating transform
  For n=0 to ½N−1 //Initialize transform level T
    Q{2n,T}=Q{n}
    Q{2n+1,T}=Q{½N+n}
  For t=T to 1 step −1 //Initialize all other levels
    For n=0 to ½N−1
      Q{2n,t−1}=Q{n,t}
      Q{2n+1,t−1}=Q{½N+n,t}

Program-3: specify how to use quantizers within a correlating transform
  For t=1 to T
    For n=0 to ½N−1

$$\begin{bmatrix} temp_1 \\ temp_2 \end{bmatrix} = \left( \begin{bmatrix} 1 & \frac{(2\alpha-1)}{2\alpha^2} \\ 0 & 1 \end{bmatrix} \begin{bmatrix} y_{n,t-1} \\ y_{N/2+n,t-1} \end{bmatrix} \right)_{Q\{n,t\}, Q\{N/2+n,t\}} \tag{6a}$$

$$\begin{bmatrix} temp_3 \\ temp_4 \end{bmatrix} = \left( \begin{bmatrix} 1 & 0 \\ -\alpha & 1 \end{bmatrix} \begin{bmatrix} temp_1 \\ temp_2 \end{bmatrix} \right)_{Q\{n,t\}, Q\{N/2+n,t\}} \tag{6b}$$

$$\begin{bmatrix} y_{2n,t} \\ y_{2n+1,t} \end{bmatrix} = \left( \begin{bmatrix} 1 & \frac{(\alpha-1)}{\alpha} \\ 0 & 1 \end{bmatrix} \begin{bmatrix} temp_3 \\ temp_4 \end{bmatrix} \right)_{Q\{n,t\}, Q\{N/2+n,t\}} \tag{6c}$$

The notation $(V)_{Q\{a,b,c\}, Q\{x,y,z\}}$ represents a quantization of the first element of a two-element vector V by the quantizer $Q\{a,b,c\}$ and a quantization of the second element of the vector V by the quantizer $Q\{x,y,z\}$.

Program-4: specify how to use quantizers within a decorrelating transform

For t=T to 1 step-1
   For n=0 to ½N−1

$$\begin{bmatrix} temp_1 \\ temp_2 \end{bmatrix} = \left( \begin{bmatrix} 1 & \frac{(\alpha-1)}{\alpha} \\ 0 & 1 \end{bmatrix} \begin{bmatrix} y_{2n,t} \\ y_{2n+1,t} \end{bmatrix} \right)_{Q\{n,t\},Q\{2n+1,t\}} \quad (7a)$$

$$\begin{bmatrix} temp_3 \\ temp_4 \end{bmatrix} = \left( \begin{bmatrix} 1 & 0 \\ \alpha & 1 \end{bmatrix} \begin{bmatrix} temp_1 \\ temp_2 \end{bmatrix} \right)_{Q\{n,t\},Q\{2n+1,t\}} \quad (7b)$$

$$\begin{bmatrix} y_{2n,t-1} \\ y_{2n+1,t-1} \end{bmatrix} = \left( \begin{bmatrix} 1 & \frac{(1-2\alpha)}{2\alpha^2} \\ 0 & 1 \end{bmatrix} \begin{bmatrix} temp_3 \\ temp_4 \end{bmatrix} \right)_{Q\{n,t\},Q\{2n+1,t\}} \quad (7c)$$

Figure 7:
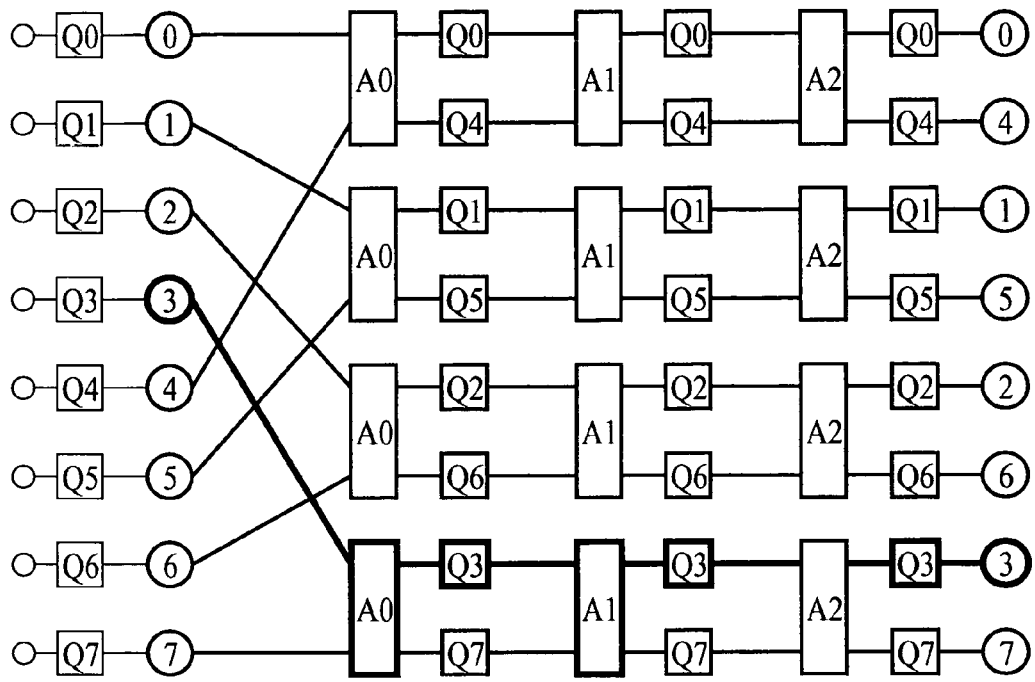
FIG. 7 is a schematic block diagram of the first level of a correlating transform using quantizers with heterogeneous quantizing resolutions.

The first tier or level t=1 of the correlating transform in equations 6a to 6c is shown by a schematic block diagram in FIG. 7 for a block of eight MDCT coefficients. The quantizers labeled Q0 through Q7 on the left-hand side of the drawing are not part of the transform but represent the different quantizers 162 that are used to quantize the MDCT coefficients with varying quantizing resolutions. For example, the block labeled Q3 represents the quantizer 162 that quantizes MDCT coefficient 3. The other blocks that are labeled Q# represent quantizers within the transform level that are used to quantize respective coefficients. The quantizing resolution that is used to quantize a particular coefficient is the same throughout the level. For example, all quantizers labeled Q3 use the same quantizing resolution. The A# blocks represent one of the 2×2 matrices shown in the equations 6a to 6c. For example, the block A0 represents the matrix appearing in equation 6a. The lines that connect the blocks show how coefficients flow through the transform level. The path that coefficient 3 follows through this level of the transform is shown with bold lines.

Figure 8:
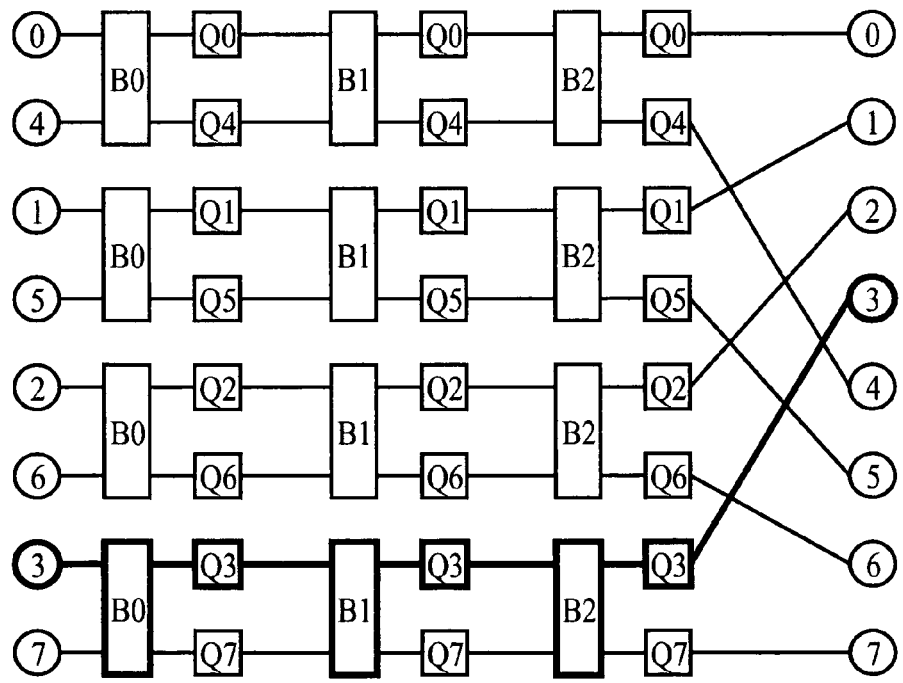
FIG. 8 is a schematic block diagram of the last level of a decorrelating transform using quantizers with heterogeneous quantizing resolutions.
Figure 9:
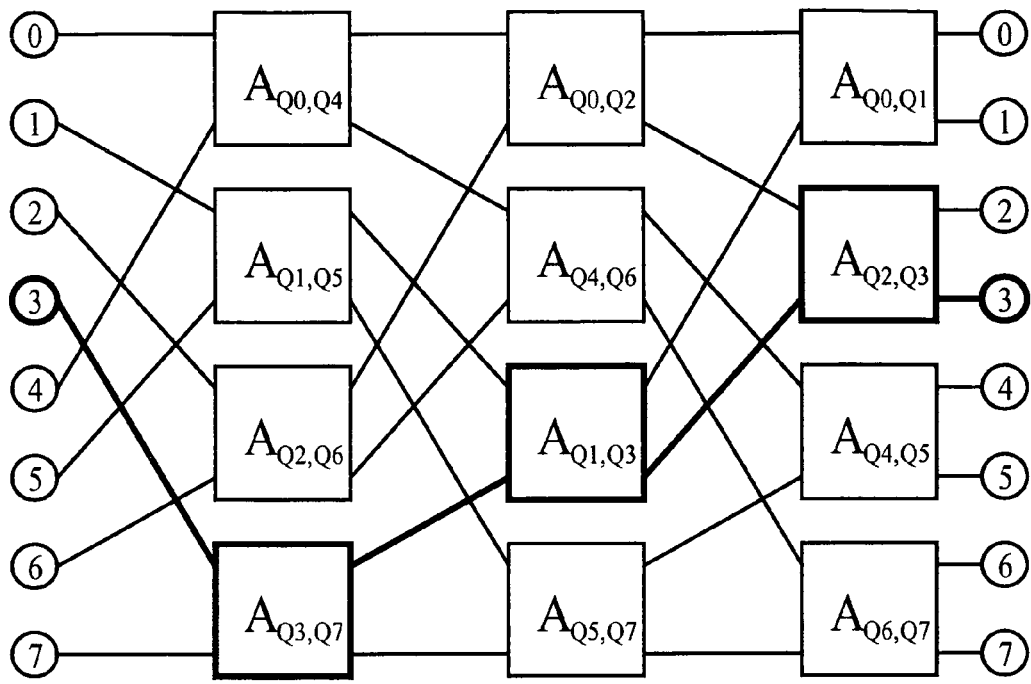
FIG. 9 is a schematic block diagram of a correlating transform with three levels using quantizers with heterogeneous quantizing resolutions.

The last tier or level t=1 of the decorrelating transform in equations 7a to 7c is shown by a schematic block diagram in FIG. 8 for a set of eight CT coefficients. The blocks that are labeled Q# represent quantizers within the transform level that are used to quantize respective coefficients. The quantizing resolution that is used to quantize a particular coefficient is the same throughout the level. For example, all quantizers labeled Q3 use the same quantizing resolution. The B# blocks represent one of the 2×2 matrices shown in the set of equations 7a to 7c. For example, the block B2 represents the matrix appearing in equation 7c. The lines that connect the blocks show how coefficients flow through the transform level. The path that coefficient 3 follows through this level of the transform is shown with bold lines. The schematic block diagram in FIG. 9 illustrates levels t=1, 2 and 3 in the correlating transform. Each of the blocks in this diagram represent all of the 2×2 matrices and quantizers for a pair of coefficients in one level of the transform. For example, the block labeled $A_{Q0,Q4}$ represents the three blocks A0, A1 and A2 with the three pairs of quantizers Q0, Q4 shown for coefficients 0 and 4 at the top of FIG. 7. The lines that connect the blocks show how coefficients flow through three transform levels. The path that coefficient 3 follows through the transform is shown with bold lines.

Figure 10:
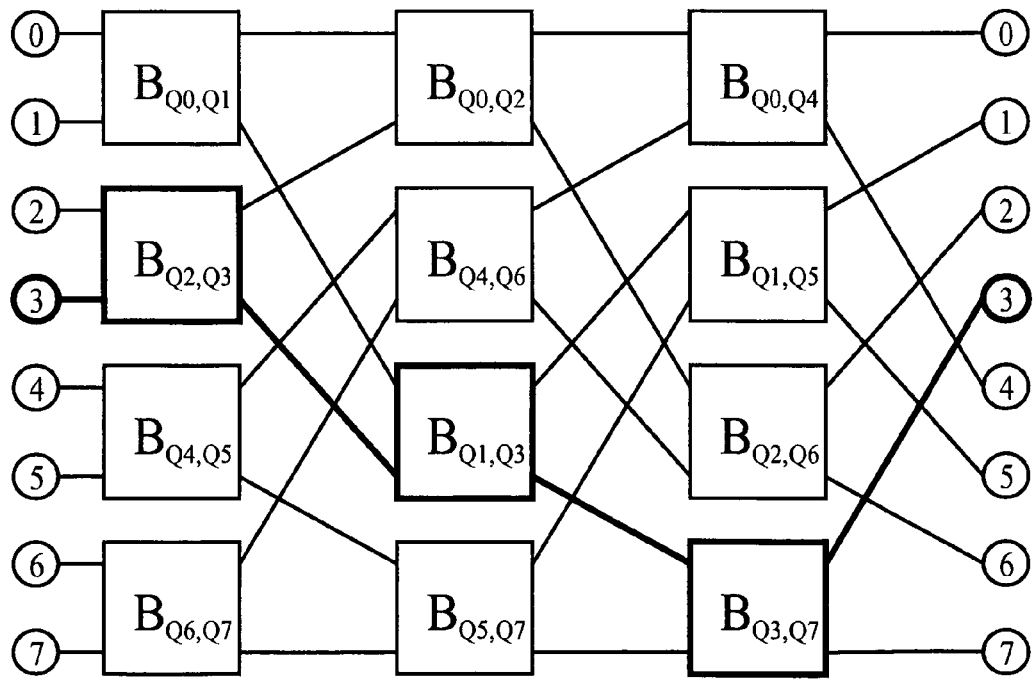
FIG. 10 is a schematic block diagram of a decorrelating transform with three levels using quantizers with heterogeneous quantizing resolutions.

The schematic block diagram in FIG. 10 illustrates levels t=3, 2 and 1 in the decorrelating transform. Each of the blocks in this diagram represent all of the 2×2 matrices and quantizers for a pair of coefficients in one level of the transform. For example, the block labeled $B_{Q0,Q4}$ represents the three blocks B0, B1 and B2 with the three pairs of quantizers Q0, Q4 shown for coefficients 0 and 4 at the top of FIG. 8. The lines that connect the blocks show how coefficients flow through three transform levels. The path that coefficient 3 follows through the transform is shown with bold lines.

b) Non-Uniform Quantizing Resolutions

The restrictions expressed in equations 5a to 5f imply the quantizer functions must be uniform and odd-symmetric. Unfortunately, many coding systems use quantizers that do not conform to these restrictions. These restrictions can be relaxed by using a mapping function F and its inverse $F^{-1}$ to map arbitrarily quantized MDCT coefficients to and from intermediate uniformly-quantized coefficients that are suitable for the transforms. The intermediate coefficients are processed by the correlating and decorrelating transforms and the mapping functions F and $F^{-1}$ convert the arbitrarily quantized MDCT coefficients into the intermediate coefficients and back again to provide a noiseless system.

The mapping functions F and $F^{-1}$ map one set of quantization levels to and from another set of quantization levels. The quantization levels to be mapped by the function F may be non-uniformly spaced but the quantization levels after mapping are uniformly spaced. The mapping functions F and $F^{-1}$ may be implemented in a variety of ways including closed-form analytic expressions or lookup tables that define a mapping between arbitrarily-spaced quantizing levels and uniformly-spaced values. The output of the mapping function F is input to the correlating transform and the output of the decorrelating transform is input to the inverse mapping function $F^{-1}$.

Figure 11:
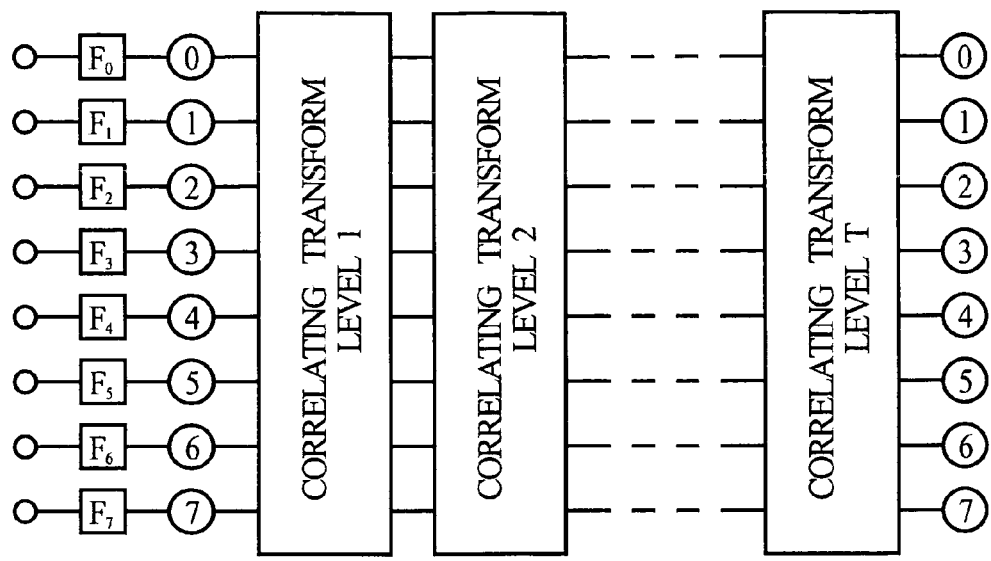
FIG. 11 is a schematic block diagram of a correlating transform with mapping functions at its inputs.
Figure 12:
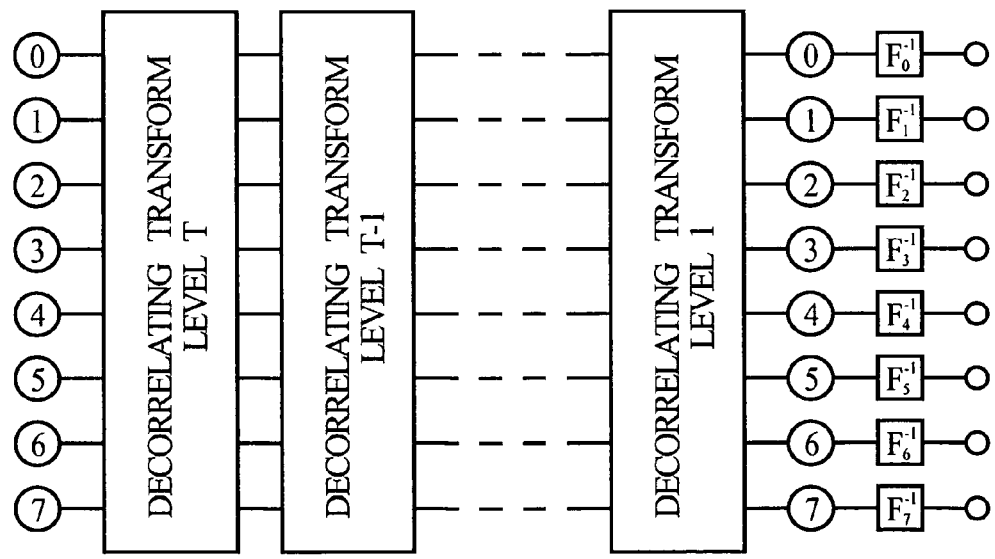
FIG. 12 is a schematic block diagram of a decorrelating transform with inverse mapping functions at its outputs.

One or more mapping functions may be used to map the MDCT coefficients in a block. For example, if a coding system forms groups MDCT coefficients to define frequency subbands, a mapping function could be used for each subband. Alternatively, a different mapping function could be used for each MDCT coefficient as shown in the examples illustrated in FIGS. 11 and 12. If more than one mapping function is used, a particular value in the mapped domain may correspond to more than one quantizing level in the quantized MDCT coefficient domain. For example, one mapping function $F_0$ and its inverse $F_0^{-1}$ may be used to map a particular MDCT coefficient $X_0$ and a different mapping function $F_1$ and its inverse $F_1^{-1}$ may be used to map a different MDCT coefficient $X_1$. Different mapping functions $F_n$ may map different quantizing levels to the same mapped value. This does not cause a problem because the correlating and decorrelating transforms are a noiseless system, allowing the correct value of the mapped coefficient to be recovered by the decorrelating transform, and the appropriate inverse mapping function $F_n^{-1}$ is used to map the recovered coefficient value back to its correct quantizing level. An example is illustrated in Table I.

TABLE I

| $F_0$ | $F_0^{-1}$ | $F_1$ | $F_1^{-1}$ | $F_2$ | $F_2^{-1}$ |
|---|---|---|---|---|---|
| $X_0$ | $U_0$ | $X_1$ | $U_1$ | $X_2$ | $U_2$ |
| 0 | 0 | 0 | 0 | 0 | 0 |
| 1 | 1 | 1 | 1 | 2 | 1 |
| 2 | 2 | 3 | 2 | 4 | 2 |
| 4 | 3 | 9 | 3 | 6 | 3 |
| 8 | 4 | — | — | 8 | 4 |

Referring to Table I, MDCT coefficient $X_0$ can be quantized to any level in the set of levels {0, 1, 2, 4, 8}. MDCT coefficient $X_1$ can be quantized to any level in the set of levels {0, 1, 3, 9}, and MDCT coefficient $X_2$ can be quantized to any level in the set of levels {0, 2, 4, 6, 8}. A set of mapping functions $F_0$, $F_1$ and $F_2$ can be used to map these quantized MDCT coefficients $X_n$ into uniformly-spaced values $U_n$ and a corresponding set of inverse mapping functions $F_0^{-1}$, $F_1^{-1}$ and $F_2^{-1}$ can be used to map the uniformly-spaced values $U_n$ back to the quantized MDCT coefficients $X_n$. In the example shown, the mapping function $F_0$ maps the quantized levels {0,1,2,4,8} for $X_0$ to the uniformly-spaced values {0,1,2,3,4} for $U_0$; the mapping function $F_1$ maps the quantized levels {0,1,3,9} for $X_1$ to the uniformly-spaced values {0,1,2,3} for $U_1$; and the mapping function $F_2$ maps the quantized levels {0,2,4,6,8} for $X_2$ to the uniformly-spaced values {0,1,2,3,4} for $U_2$. The corresponding functions $F_0^{-1}$, $F_1^{-1}$ and $F_2^{-1}$ map these values and levels in the reverse direction.

If the MDCT coefficients are quantized as $X_0=8$, $X_1=3$ and $X_2=0$, then the function $F_0$ maps $X_0=8$ to the value $U_0=4$, the function $F_1$ maps $X_1=3$ to the value $U_1=2$, and the function $F_2$ maps $X_2=0$ to the value $U_2=0$. The mapped values $U_n$ can be processed noiselessly by the transforms shown in equations 6a to 6c and 7a to 7c. The inverse function $F_0^{-1}$ maps $U_0=4$ to $X_0=8$, the inverse function $F_1^{-1}$ maps $U_1=2$ to $X_1=3$, and the inverse function $F_2^{-1}$ maps $U_2=0$ to $X_2=0$, thereby recovering the correct quantizing levels for the quantized MDCT coefficients.

Mapping functions may be used with the transforms expressed in equations 3 and 4 as well as the transforms expressed in equations 6 and 7. Mapping functions could also be used with the transforms expressed in equations 3 and 4 to map quantized MDCT coefficients with heterogeneous quantizing resolutions to and from quantized MDCT coefficients with homogeneous quantizing resolutions. The encoder 16 can include in the encoded signal 4 any control information that is required by the decoder 24 to use the appropriate inverse mapping functions.

2. Efficient Implementation of Transforms

A direct implementation of the correlating and decorrelating transforms discussed above are computationally intensive because these transforms must operate on many pairs of values one pair at a time. Additional resources are needed to perform the interim quantizing operations for the transforms expressed in equations 3, 4, 6 and 7. This situation is very undesirable in applications that require an inexpensive implementation of the receiver 20. A way to implement these transform more efficiently is described below.

a) Fast Hadamard Transform

It can be shown that a Fast Hadamard Transform (FHT) can produce identical results to those obtained by a direct implementation of the correlating and decorrelating transforms expressed in equations 1 and 2 when $\alpha=\frac{1}{2}\sqrt{2}$. The FHT implementation can improve efficiency by more than 70%, where the exact amount of improvement depends on the number of transform levels T and the block size N. Empirical studies have also shown that choosing $\alpha=\frac{1}{2}\sqrt{2}$ provides a good tradeoff between the increase in encoded signal bit rate that the correlating transform introduces and the perceived quality of the decoded signal when several MDCT coefficients are lost or corrupted. The correlating transform expressed in equation 1 may be implemented by $$\begin{pmatrix} y_{gD,T} \\ y_{gD+1,T} \\ y_{gD+2,T} \\ \cdots \\ y_{gD+(D-1),T} \end{pmatrix} = \left(\frac{\sqrt{2}}{2}\right)^T H_T \begin{pmatrix} x_{g+(D-1)G} \\ \cdots \\ x_{g+2G} \\ x_{g+G} \\ x_g \end{pmatrix}, g \in [0, G-1] \quad (8)$$

and the decorrelating transform expressed in equation 2 may be implemented by $$\begin{pmatrix} x_{g+(D-1)G} \\ \cdots \\ x_{g+2G} \\ x_{g+G} \\ x_g \end{pmatrix} = H_T^{-1} \left(\frac{\sqrt{2}}{2}\right)^{-T} \begin{pmatrix} y_{gD,T} \\ y_{gD+1,T} \\ y_{gD+2,T} \\ \cdots \\ y_{gD+(D-1),T} \end{pmatrix}, g \in [0, G-1] \quad (9)$$

where
T=number of transform levels, where $T \geq 1$;
N=number of MDCT coefficients in a block;
D=number of descriptions, where $D=2^T$;
G=number of groups, where $$G = \frac{N}{D}$$

and T is such that G is even;
$x_n$=MDCT coefficient n, where $0 \leq n \leq N-1$;
$y_{n,t}$=CT coefficient n at transform level t, where $1 \leq t \leq T$; and
$H_k$=k-level Hadamard matrix.

The k-level Hadamard matrix is of dimension $2^k$ by $2^k$ and is defined as $$H_k = H_{k-1} \otimes H_1 = \begin{bmatrix} H_{k-1} & H_{k-1} \\ H_{k-1} & -H_{k-1} \end{bmatrix}$$

where $$H_1 = \begin{bmatrix} 1 & 1 \\ 1 & -1 \end{bmatrix}.$$

Efficient techniques for implementing the FHT can compute the Hadamard matrix $H_k$ with a computational complexity of $2^k \log_2(2^k)$. Additional information about how the FHT can be implemented may be obtained from Lee et al., "Fast Hadamard Transform Based on a Simple Matrix Factorization," IEEE Trans. on Acoust., Speech and Sig. Proc., 1986, vol. ASSSP-34, no. 6, pp. 1666-1667.

The correlating transform expressed in equation 8 separates the MDCT coefficients into G groups of D coefficients and uses the FHT to calculate the Hadamard matrix $H_k$ for each group. The decorrelating transform expressed in equation 9 operates similarly.

b) Heterogeneous and Non-Uniform Quantizing Resolutions

The implementation of the transforms as expressed in equations 8 and 9 is much more efficient than the direct implementation as expressed in equations 1 and 2 but the ability of the decorrelating transform to recover the exact value of the MDCT coefficients is still subject to the same constraints imposed by the less efficient implementation. Perfect recovery of the MDCT coefficients is not possible unless the MDCT coefficients are uniformly quantized with the same quantizing resolution.

The restrictions imposed on the quantization of the MDCT coefficients can be avoided by using mapping functions as described above and as illustrated in FIGS. 11 and 12, for example. One or more mapping functions F can be used to map arbitrarily quantized MDCT coefficients into uniformly and homogeneously quantized interim coefficients, which can be processed noiselessly by the transforms expressed in equations 7 and 8, and one or more inverse mapping functions $F^{-1}$ can map the recovered interim coefficients back to the original arbitrarily quantized MDCT coefficients.

3. Variations

The different implementations discussed above offer advantages with respect to one another. The transform implementation expressed in equations 6 and 7 allows flexibility in choosing the value of the correlation parameter $\alpha$ to trade off bit-rate and sound-quality constraints that may be imposed on a coding system. The transform implementation expressed in equations 8 and 9 dictates the value of the correlation parameter $\alpha$ but it is more efficient. These two implementations may be used together in a variety of ways.

In one variation, the efficient implementation of equations 8 and 9 is used to process a majority of the MDCT coefficients in a block of coefficients and the flexible implementation of equations 6 and 7 with a more optimized value for the correlation parameter $\alpha$ is used to process the MDCT coefficients in portions of the spectrum that are more important to the perceived quality of the signal. The division of the spectrum between the two implementations may be fixed or it may be adapted.

In another variation, the two implementations are selected adaptively in response to signal characteristics or in response to changing needs of the coding system.

4. Other Considerations

Various aspects of the present invention may be used advantageously in coding applications such as wireless multimedia applications where portions of an encoded signal may be lost or corrupted during transmission. Simulations and empirical studies suggest that the perceived quality of the decoded output signal 6 can be improved when one or more error-mitigation techniques are implemented in the decoder 24.

A technique called "spectrum renormalization" adjusts the level of one or more recovered subband signals 25 to conform to an estimated spectral contour 19. In situations where the decoder 24 must estimate spectral information that has been lost or corrupted, the resulting spectral contour of the output signal 6 may differ significantly with the spectral contour of the original source signal 2. Spectrum normalization adjusts the level of one or more subband signals 25 as needed to obtain a spectral contour that is similar to the original spectral contour. Preferably, the estimated spectral contour 19 comprises a spectral level for each of several subbands having a uniform spectral width. Non-uniform subband widths may used as desired to satisfy various system or sound quality requirements.

A technique called "interleaving" is a form of time diversity for a single source signal 2. Different intervals of the same signal are rearranged and time-multiplexed before being input to the encoder 16. An appropriate and inverse process is applied to the output of the decoder 24.

A technique referred to as "repeat last-known value" estimates missing or corrupted information for the estimated spectral contour 19. If any contour information is missing or corrupted for a particular segment of the source signal 2, it can be replaced by its last known value.

A technique that is similar to the "repeat last-known value" technique may be used to mitigate errors when other techniques fail or cannot be used. This technique replaces missing or corrupted portions of the encoded signal 4 with a previous portion. For example, if the encoded signal 4 is arranged in packets, the contents of a missing packet can be replaced by the contents of a previous packet.

A technique referred to as "low-frequency variance estimation" is a statistical estimation technique that may be used in the decoder 24 to derive estimates of the low-frequency spectral contour. The technique exploits the correlation between CT coefficients to estimate low-frequency spectral contour information from variance information received in the encoded signal 4 for higher-frequency MDCT coefficients and from variances of CT coefficients computed by the decoder 24. Low-frequency variance estimation can reduce the amount of spectral contour information included in the encoded signal 4 by allowing the decoder 24 to rely on contour information for only a limited set of higher-frequency coefficients.

For example, suppose there are two MDCT coefficients and one transform level so that N=2 and T=1 in equation 1. Then the correlating transform can be written as $$y_{0,1} = \alpha y_{0,0} + \frac{1}{2\alpha} y_{1,0} \tag{10}$$

$$y_{1,1} = -\alpha y_{0,0} + \frac{1}{2\alpha} y_{1,0}$$

where $y_{0,0}$ and $y_{1,0}$ = low- and high-frequency MDCT coefficients, respectively, and $y_{0,1}$ and $y_{1,1}$ = the two CT coefficients.

Assuming that the MDCT coefficients are uncorrelated, the equations in expression 11 can be used to find two different expressions for the variance $\sigma_{y_{0,0}}^2$ of the low-frequency MDCT coefficient $y_{0,0}$:

$$\sigma_{y_{0,0}}^2 = \frac{1}{\alpha^2} \left( \sigma_{y_{0,1}}^2 - \frac{1}{4\alpha^2} \sigma_{y_{1,0}}^2 \right) \tag{11}$$

$$\sigma_{y_{0,0}}^2 = \frac{1}{\alpha^2} \left( \sigma_{y_{1,1}}^2 - \frac{4}{4\alpha^2} \sigma_{y_{1,0}}^2 \right)$$

The implementation of the decoder 24 discussed here requires spectral contour information represented by the variances $\sigma_{y_{0,0}}^2$ and $\sigma_{y_{1,0}}^2$ of the two MDCT coefficients $y_{0,0}$ and $y_{1,0}$ to use the spectral interpolation, renormalization and missing coefficient techniques described above. Expression 11, however, provides two estimates of the variance information $\sigma_{y_{0,0}}^2$ for the low-frequency MDCT coefficient $y_{0,0}$. These estimates depend on only the variance $\sigma_{y_{1,0}}^2$ of the high-frequency MDCT coefficient $y_{1,0}$ and the variance of one CT coefficient. Because the variance of the CT coefficient can be computed by the decoder 24, only the variance of the high-frequency MDCT coefficient $y_{1,0}$ needs to be provided to the decoder 24 in the encoded signal 4. The decoder 24 may choose to use either equation in expression 11, or it may use an average or some other combination of these expressions to derive an estimate of the low-frequency variance $\sigma_{y_{0,0}}^2$.

In implementations of typical coding systems, N is much larger than two and relationships between the variances of MDCT coefficients and variances of CT coefficients are typically not as simple as those given above. Furthermore, some MDCT variance information in the encoded signal 4, which may be transmitted as the estimated spectral contour discussed above, may be lost or corrupted en route to the decoder. In cases such as these, various techniques such as averaging can be used to estimate low-frequency variance information from the available MDCT variance information and the available CT coefficients. Alternate expressions for the same variance information, such as the two equations in expression 11 for the low-frequency variance information, make these techniques possible.

C. Implementation

Figure 13:
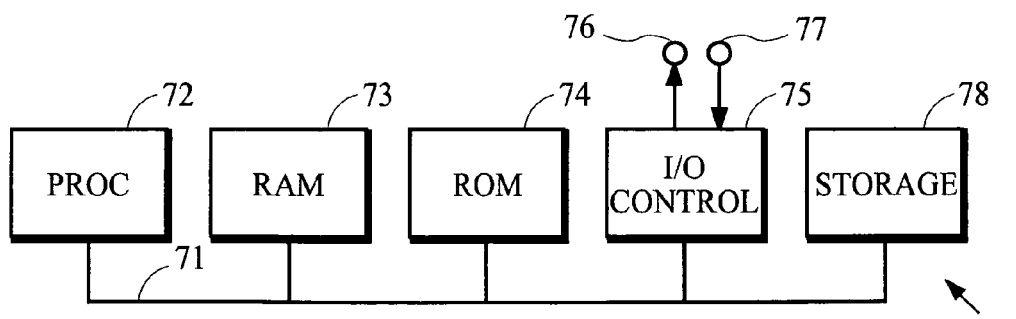
FIG. 13 is a schematic block diagram of a device that may be used to implement various aspects of the present invention.

Devices that incorporate various aspects of the present invention may be implemented in a variety of ways including software for execution by a computer or some other device that includes more specialized components such as digital signal processor (DSP) circuitry coupled to components similar to those found in a general-purpose computer. FIG. 13 is a schematic block diagram of a device 70 that may be used to implement aspects of the present invention. The processor 72 provides computing resources. RAM 73 is system random access memory (RAM) used by the processor 72 for processing. ROM 74 represents some form of persistent storage such as read only memory (ROM) for storing programs needed to operate the device 70 and possibly for carrying out various aspects of the present invention. I/O control 75 represents interface circuitry to receive and transmit signals by way of the communication channels 76, 77. In the embodiment shown, all major system components connect to the bus 71, which may represent more than one physical or logical bus; however, a bus architecture is not required to implement the present invention.

In embodiments implemented by a general purpose computer system, additional components may be included for interfacing to devices such as a keyboard or mouse and a display, and for controlling a storage device 78 having a storage medium such as magnetic tape or disk, or an optical medium. The storage medium may be used to record programs of instructions for operating systems, utilities and applications, and may include programs that implement various aspects of the present invention.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

The invention claimed is:

1. A method for signal processing in a coding system comprising:

receiving sets of quantized signal elements, each set of quantized signal elements representing a respective segment of a signal, wherein the quantized signal elements are quantized representations of signal components having different quantizing resolutions;

applying a correlating transform to the sets of quantized signal elements to generate corresponding sets of transform coefficients, wherein each set of quantized signal elements is less correlated than the corresponding set of transform coefficients, and wherein the correlating transform is implemented by an invertible mapping function followed by a plurality of transforms interleaved with quantization functions, the invertible mapping function maps the quantized signal elements into a set of values $\{x\}$ that are quantized according to a quantization function $Q$ such that $Q(x+y)=x+Q(y)$ and $Q(-y)=-Q(y)$ for all x in $\{x\}$ and for all y that are real numbers, and the correlating transform permits exact recovery of the quantized signal elements from the transform coefficients by a complementary decorrelating transform when there are no errors caused by insufficient precision of arithmetic calculations used to implement the correlating and decorrelating transforms;

deriving groups of quantized values from the sets of transform coefficients, wherein a respective group of quantized values contains sufficient information from which an inexact replica of one or more segments of the signal can be recovered and wherein an increasingly accurate replica of the one or more segments of the signal can be recovered from an increasing number of the groups of quantized values; and generating one or more output signals that convey information representing the groups of quantized values.

2. The method according to claim 1, wherein the correlating transform is implemented by a plurality of transforms interleaved with quantization functions, and the quantization functions have quantizing resolutions corresponding to the quantizing resolutions of the quantized signal elements.

3. The method according to claim 1, wherein the invertible mapping function maps the quantized signal elements into one or more sets of uniformly quantized values having the same quantizing resolution within a respective set.

4. The method according to claim 1, wherein each of the plurality of transforms is implemented by a Hadamard transform.

5. A method for signal processing in a coding system comprising:

receiving groups of quantized values, wherein a respective group of quantized values contains sufficient information from which an inexact replica of one or more segments of a signal can be recovered and wherein an increasingly accurate replica of the one or more segments of the signal can be recovered from an increasing number of the groups of quantized values;

deriving sets of transform coefficients from the groups of quantized values;

applying a decorrelating transform to the sets of transform coefficients to generate corresponding sets of quantized signal elements, wherein each set of transform coefficients is more correlated than the corresponding set of quantized signal elements and each set of quantized signal elements represents a respective segment of a signal, wherein the quantized signal elements are quantized representations of signal components having different quantizing resolutions, and wherein the decorrelating transform is implemented by a plurality of transforms interleaved with quantization functions followed by an invertible mapping function, the invertible mapping function maps the quantized signal elements from a set of values $\{x\}$ that are quantized according to a quantization function Q such that $Q(x+y)=x+Q(y)$ and $Q(-y)=-Q(y)$ for all x in $\{x\}$ and for all y that are real numbers, and the decorrelating transform permits exact recovery of the quantized signal elements from the transform coefficients that were generated by a complementary correlating transform when there are no errors caused by insufficient precision of arithmetic calculations used to implement the correlating and decorrelating transforms; and generating one or more output signals that convey information representing the sets of quantized signal elements.

6. The method according to claim 5, wherein the decorrelating transform is implemented by a plurality of transforms interleaved with quantization functions, and the quantization functions have quantizing resolutions corresponding to the quantizing resolutions of the quantized signal elements.

7. The method according to claim 5, wherein the invertible mapping function maps the quantized signal elements from one or more sets of uniformly quantized values having the same quantizing resolution within a respective set.

8. The method according to claim 5, wherein each of the plurality of transforms is implemented by an inverse Hadamard transform.

9. A storage medium recording a program of instructions that is executable by a device to perform a method for signal processing in a coding system, wherein the method comprises:

receiving sets of quantized signal elements, each set of quantized signal elements representing a respective segment of a signal, wherein the quantized signal elements are quantized representations of signal components having different quantizing resolutions;

applying a correlating transform to the sets of quantized signal elements to generate corresponding sets of transform coefficients, wherein each set of quantized signal elements is less correlated than the corresponding set of transform coefficients, and wherein the correlating transform is implemented by an invertible manning function followed by a plurality of transforms interleaved with quantization functions, the invertible mapping function maps the quantized signal elements into a set of values $\{x\}$ that are quantized according to a quantization function Q such that $Q(x+y)=x+Q(y)$ and $Q)-y)=-Q(y)$ for all x in $\{x\}$ and for all y that are real numbers, and the correlating transform permits exact recovery of the quantized signal elements from the transform coefficients by a complementary decorrelating transform when there are no errors caused by insufficient precision of arithmetic calculations used to implement the correlating and decorrelating transforms;

deriving groups or quantized values from the sets of transform coefficients, wherein a respective group of quantized values contains sufficient information from which an inexact replica of one or more segments of the signal can be recovered and wherein an increasingly accurate replica of the one or more segments of the signal can be recovered from an increasing number of the groups of quantized values; and generating one or more output signals that convey information representing the groups of quantized values.

10. The medium according to claim 9, wherein the correlating transform is implemented by a plurality of transforms interleaved with quantization functions, and the quantization functions have quantizing resolutions corresponding to the quantizing resolutions of the quantized signal elements.

11. The medium according to claim 9, wherein the invertible mapping function maps the quantized signal elements into one or more sets of uniformly quantized values having the same quantizing resolution within a respective set.

12. The medium according to claim 9, wherein each of the plurality of transforms is implemented by a Hadamard transform.

13. A storage medium recording a program of instructions that is executable by a device to perform a method for signal processing in a coding system, wherein the method comprises:

receiving groups of quantized values, wherein a respective group of quantized values contains sufficient information from which an inexact replica of one or more segments of a signal can be recovered and wherein an increasingly accurate replica of the one or more segments of the signal can be recovered from an increasing number of the groups of quantized values;

deriving sets of transform coefficients from the groups of quantized values;

applying a decorrelating transform to the sets of transform coefficients to generate corresponding sets of quantized signal elements, wherein each set of transform coefficients is more correlated than the corresponding set of quantized signal elements and each set of quantized signal elements represents a respective segment of a signal, wherein the quantized signal elements are quantized representations of signal components having different quantizing resolutions, and wherein the decorrelating transform is implemented by a plurality of transforms interleaved with quantization functions followed by an invertible mapping function, the invertible mapping function maps the quantized signal elements from a set of values $\{x\}$ that are quantized according to a quantization function Q such that $Q(x+y)=x+Q(y)$ and $Q(-y)=-Q(y)$ for all x in $\{x\}$ and for all y that are real numbers, and the decorrelating transform permits exact recovery of the quantized signal elements from the transform coefficients that were generated by a complementary correlating transform when there are no errors caused by insufficient precision of arithmetic calculations used to implement the correlating and decorrelating transforms; and generating one or more output signals that convey information representing the sets of quantized signal elements.

14. The medium according to claim 13, wherein the decorrelating transform is implemented by a plurality of transforms interleaved with quantization functions, and the quantization functions have quantizing resolutions corresponding to the quantizing resolutions of the quantized signal elements.

15. The medium according claim 13, wherein the invertible mapping function maps the quantized signal elements from one or more sets of uniformly quantized values having the same quantizing resolution within a respective set.

16. The medium according claim 13, wherein each of the plurality of transforms is implemented by an inverse Hadamard transform.

17. An apparatus for signal processing in a coding system, wherein the apparatus comprises:
  means for receiving sets of quantized signal elements, each set of quantized signal elements representing a respective segment of a signal, wherein the quantized signal elements are quantized representations of signal components having different quantizing resolutions;
  means for applying a correlating transform to the sets of quantized signal elements to generate corresponding sets of transform coefficients, wherein each set of quantized signal elements is less correlated than the corresponding set of transform coefficients, and wherein the correlating transform is implemented by an invertible mapping function followed by a plurality of transforms interleaved with quantization functions, the invertible mapping function maps the quantized signal elements into a set of values $\{x\}$ that are quantized according to a quantization function Q such that $Q(x+y)=x+Q(y)$ and $Q(-y)=-Q(y)$ for all x in $\{x\}$ and for all y that are real numbers, and the correlating transform permits exact recovery of the quantized signal elements from the transform coefficients by a complementary decorrelating transform when there are no errors caused by insufficient precision of arithmetic calculations used to implement the correlating and decorrelating transforms;
  means for deriving groups of quantized values from the sets of transform coefficients, wherein a respective group of quantized values contains sufficient information from which an inexact replica of one or more segments of the signal can be recovered and wherein an increasingly accurate replica of the one or more segments of the signal can be recovered from an increasing number of the groups of quantized values; and
  means For generating one or more output signals that convey information representing the groups of quantized values.

18. The apparatus according to claim 17, wherein the correlating transform is implemented by a plurality of transforms interleaved with quantization functions, and the quantization functions have quantizing resolutions corresponding to the quantizing resolutions of the quantized signal elements.

19. The apparatus according to claim 17, wherein the invertible mapping function maps die quantized signal elements into one or more sets of uniformly quantized values having the same quantizing resolution within a respective set.

20. The apparatus according to claim 17, wherein each of the plurality of transforms is implemented by a Hadamard transform.

21. An apparatus for signal processing in a coding system, wherein the apparatus comprises:
  means for receiving groups of quantized values, wherein a respective group of quantized values contains sufficient information from which an inexact replica of one or more segments of a signal can be recovered and wherein an increasingly accurate replica of the one or more segments of the signal can be recovered from an increasing number of the groups of quantized values;
  means For deriving sets of transform coefficients from the groups of quantized values;
  means for applying a decorrelating transform to the sets of transform coefficients to generate corresponding sets of quantized signal elements, wherein each set of transform coefficients is more correlated than the corresponding set of quantized signal elements and each set of quantized signal elements represents a respective segment of a signal, wherein the quantized signal elements are quantized representations of signal components having different quantizing resolutions, and wherein the decorrelating transform is implemented by a plurality of transforms interleaved with quantization functions followed by an invertible mapping function, the invertible mapping function maps the quantized signal elements from a set of values $\{x\}$ that are quantized according to a quantization function Q such that $Q(x+y)=x+Q(y)$ and $Q(-y)=-Q(y)$ for all x in $\{x\}$ and for all y that are real numbers, and the decorrelating transform permits exact recovery of the quantized signal elements from the transform coefficients that were generated by a complementary correlating transform when there are no errors caused by insufficient precision of arithmetic calculations used to implement the correlating and decorrelating transforms; and
  means for generating one or more output signals that convey information representing the sets of quantized signal elements.

22. The apparatus according to claim 21, wherein the decorrelating transform is implemented by a plurality of transforms interleaved with quantization functions, and the quantization functions have quantizing resolutions corresponding to the quantizing resolutions of the quantized signal elements.

23. The apparatus according to claim 21, wherein the invertible mapping function maps the quantized signal elements from one or more sets of uniformly quantized values having the same quantizing resolution within a respective set.

24. The apparatus according to claim 21, where in each of the plurality of transforms is implemented by an inverse Hadamard transform.

* * * * *